United States Patent [19]

Kawamura et al.

[11] Patent Number: 5,238,782
[45] Date of Patent: Aug. 24, 1993

[54] PHOTOPOLYMERIZABLE COMPOSITION

[75] Inventors: Koichi Kawamura; Mitsuru Koike, both of Shizuoka, Japan

[73] Assignee: Fuji Photo Film Co., Ltd., Kanagawa, Japan

[21] Appl. No.: 484,277

[22] Filed: Feb. 26, 1990

Related U.S. Application Data

[63] Continuation of Ser. No. 137,075, Dec. 23, 1987, abandoned.

[30] Foreign Application Priority Data

Dec. 26, 1986 [JP]  Japan .................................. 61-315194

[51] Int. Cl.$^5$ ............................................. G03C 1/729
[52] U.S. Cl. .................................... 430/281; 430/913; 430/920; 430/922; 522/34; 522/51; 522/53; 522/54; 522/57; 522/63
[58] Field of Search ............... 430/281, 913, 920, 922; 522/63, 53, 54, 51, 55, 57

[56] References Cited

U.S. PATENT DOCUMENTS

| | | | |
|---|---|---|---|
| Re. 28,789 | 4/1979 | Chang ................... | 430/920 |
| 4,147,552 | 4/1979 | Specht et al. ................... | 96/115 |
| 4,272,609 | 6/1981 | Klupfel ................... | 430/920 |
| 4,289,844 | 9/1981 | Specht et al. ................... | 430/281 |
| 4,318,791 | 3/1982 | Felder et al. ................... | 430/920 |
| 4,366,228 | 12/1982 | Specht et al. ................... | 430/281 |
| 4,698,286 | 10/1987 | Messer ................... | 430/920 |
| 4,749,643 | 6/1988 | Ohlschlager et al. ............... | 430/931 |

OTHER PUBLICATIONS

"Ketocoumarins as Photosensitizers and Photoinitiators" by J. L. R. Wiliams et al, Polymer Engineerig & Science, Dec. 1983, vol. 23, No. 18.
"Ketocoumarins" A New Class of Triplet Sensitizers, Specht et al, Tetrahedron, vol. 38, No. 9.

*Primary Examiner*—Jack P. Brammer
*Attorney, Agent, or Firm*—Burns, Doane, Swecker & Mathis

[57] ABSTRACT

A photopolymerizable composition comprises at least one addition polymerizable compound having at least one ethylenically unsaturated·bond and at least one photopolymerization initiator represented by the following general formula (I):

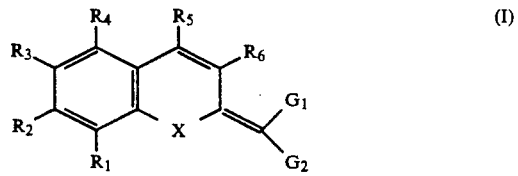

wherein $R_1$ to $R_4$ independently represent hydrogen atom, a halogen atom, a substituted or unsubstituted alkyl group, a substituted or unsubstituted aryl group, hydroxyl group, a substituted or unsubstituted alkoxy group, or a substituted or unsubstituted amino group with the proviso that $R_1$ to $R_4$ may form a non-metallic ring together with the carbon atoms bonded thereto; $R_5$ and $R_6$ each represents hydrogen atom, a substituted or unsubstituted alkyl group, a substituted or unsubstituted aryl group, a heteroaromatic group, an acyl group, cyano group, an alkoxycarbonyl group, carboxyl group or a substituted alkenyl group with the proviso that $R_5$ and $R_6$ may form a non-metallic ring together with the carbon atoms bonded thereto; X represents O, S, NH or a nitrogen atom having a substituent; and $G_1$ and $G_2$ each represents hydrogen atom, cyano group, a substituted or unsubstituted alkoxycarbonyl group, a substituted or unsubstituted aryloxycarbonyl group, a substituted or unsubstituted acyl group, a substituted or unsubstituted arylcarbonyl group, an alkylthio group, an arylthio group, an alkylsulfonyl group, an arylsulfonyl group or a fluorosulfonyl group with the proviso that $G_1$ and $G_2$ cannot simultaneously represent hydrogen atom and that $G_1$ and $G_2$ may form a non-metallic ring together with the carbon atoms bonded thereto. This composition provides light-sensitive layer of highly sensitive to light from a variety of light sources.

15 Claims, No Drawings

PHOTOPOLYMERIZABLE COMPOSITION

This application is a continuation of application Ser. No. 137,075, filed Dec. 23, 1987.

BACKGROUND OF THE INVENTION

1. Field of the Invention

The present invention relates to a photopolymerizable composition and more particularly to a photopolymerizable composition comprising an addition polymerizable compound having ethylenically unsaturated bonds, a photopolymerization initiator and optionally a binder, which is useful as a light-sensitive layer of presensitized plate for use in making lithographic printing plates, a light-sensitive layer for use in making color proofs, a photoresist for use in making print circuit board and the like.

2. Description of the Prior Art

It has been well known to form duplicates of images according to a photographic manner utilizing a light-sensitive composition composed of a polymerizable compound having ethylenically unsaturated bonds and a photopolymerization initiator, which optionally contains a proper binder capable of forming a film and a heat polymerization inhibitor. As disclosed in U.S. Pat. Nos. 2,927,022; 2,902,356 and 3,870,524, such kind of light-sensitive compositions make it possible to provide desired images of hardened light-sensitive composition by forming a proper film therefrom, exposing it to light through a negative carrying desired images thereon and removing unexposed areas by selectively dissolving them with a proper solvent (hereunder referred to as simply development), since the light-sensitive composition causes photopolymerization by irradiating it with light and thus causes hardening to make the exposed portions insoluble in a developer. It is a matter of course that this kind of light-sensitive composition is very useful for forming a presensitized plate (hereunder referred to as PS plate), a photoresist or the like.

Moreover, it has been proposed to incorporate, into the foregoing light-sensitive composition, a photopolymerization initiator for the purpose of improving the light-sensitivity thereof since a sufficient light-sensitivity cannot be expected by simply using a polymerizable compound having ethylenically unsaturated bonds and there has been used such a photopolymerization initiator as benzil, benzoin, benzoin ethyl ether, Michler's ketone, anthraquinone, acridine, phenazine, benzophenone or 2-ethylanthraquinone.

However, when such a photopolymerization initiator is used, the resultant light-sensitive composition is inferior in sensitivity to hardening and thus it takes a long period of time to expose it to light to form images. For this reason, the image having a good performance is not reproduced in the case of the reproduction of fine images even when there is a slight vibration in the operations of imagewise exposure. In this case, it is further required to increase the dosage of radiant rays from a light source for exposure and, therefore, it must be provided for a means for diffusing a great deal of heat generated during the exposure operation. In addition, the heat generated exerts a severe influence on the film of the light-sensitive composition and thus causes the deformation and the change of properties thereof.

Recently, it has been investigated to improve the light-sensitive composition in its sensitivity to ultraviolet light and since UV projection techniques have already been put into practical use for manufacturing PS plates or the like the corresponding light-sensitive materials of high sensitivity is now under development. However, such light-sensitive materials are still insufficient in sensitivity.

SUMMARY OF THE INVENTION

Accordingly, it is a primary purpose of the present invention to provide a photopolymerizable composition having a high sensitivity.

It is another purpose of the present invention to provide a photopolymerizable composition which comprises a photopolymerization initiator capable of enhancing the photopolymerization velocity of the photopolymerizable composition generally containing a polymerizable compound having ethylenically unsaturated bonds.

The inventors of the present invention have conducted various studies to achieve the aforementioned purposes and as a result, have found that certain specific photopolymerization initiators allow for the polymerizable compound having ethylenically unsaturated bonds to increase the photopolymerization velocity thereof and thus have completed the present invention.

Consequently, the present invention relates to a photopolymerizable composition which comprises at least one addition polymerizable compound having at least one ethylenically unsaturated bond and a photopolymerization initiator and the composition is characterized in that it comprises, as the photopolymerization initiator, at least one compound represented by the following general formula (I):

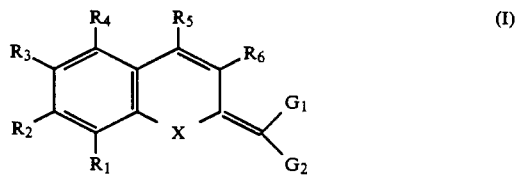

wherein $R_1$ to $R_4$ each independently represents hydrogen atom, a halogen atom, an alkyl group, a substituted alkyl group, an aryl group, a substituted aryl group, hydroxyl group, an alkoxy group, a substituted alkoxy group, an amino group or a substituted amino group with the proviso that $R_1$ to $R_4$ may form a ring comprised of non-metallic atoms together with the carbon atoms to which they are bonded; $R_5$ and $R_6$ each independently represents hydrogen atom, an alkyl group, a substituted alkyl group, an aryl grouyp, a substituted aryl group, a heteroaromatic group, an acyl group, cyano group, an alkoxycarbonyl group, carboxyl group or a substituted alkenyl group with the proviso that $R_5$ and $R_6$ may form a ring composed of non-metallic atoms together with the carbon atoms to which they are bonded; X represents oxygen atom, sulfur atom, NH or a nitrogen atom having a substituent; $G_1$ and $G_2$ may or may not be identical and each represents hydrogen atom, cyano group, an alkoxycarbonyl group, a substituted alkoxycarbonyl group, an aryloxycarbonyl group, a substituted aryloxycarbonyl group, an acyl group, a substituted acyl group, an arylcarbonyl group, a substituted arylcarbonyl group, an alkylthio group, an arylthio group, an alkylsulfonyl group, an arylsulfonyl group or a fluorosulfonyl group with the proviso that $G_1$ and $G_2$ cannot simultaneously represent hydrogen atom and that $G_1$ and $G_2$ may form a ring of non-metallic atoms together with the carbon atoms to which they are bonded.

DETAILED EXPLANATION OF THE INVENTION

The photopolymerizable composition according to the present invention will hereunder be described in more detail.

The polymerizable compound having ethylenically unsaturated bonds as used herein is preferably those having, in the chemical structure thereof, at least one ethylenically unsaturated bond at the terminal thereof, which are in any chemical form such as monomer, prepolymer, i.e., dimer, trimer and an oligomer or a mixture thereof or a copolymer thereof.

Examples of such monomers and copolymers thereof include such an unsaturated carboxylic acid or a salt thereof as acrylic acid, methacrylic acid, itaconic acid, crotonic acid, maleic acid and sodium and potassium salts of these acids; such an ester as those of unsaturated carboxylic acids and aliphatic polyol compounds and such an amide as those of unsaturated carboxylic acids and aliphatic polyamine compounds.

Examples of esters of an aliphatic polyol compound and an unsaturated carboxylic acid include such acrylates as ethylene glycol diacrylate, triethylene glycol triacrylate, 1,3-butanediol diacrylate, tetramethylene glycol diacrylate, propylene glycol diacrylate, trimethylol propane triacrylate, trimethylol propane tri(acryloyl-oxypropyl) ether, trimethylol ethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetraacrylate, sorbitol pentaacrylate, sorbitol hexaacrylate and polyester acrylate oligomers; such methacrylates as tetramethylene glycol dimethacrylate, triethylene glycol dimethacrylate, trimethylol propane methacrylate, trimethylol ethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis(p-(3-methacryloxy-2-hydroxypropoxy)phenyl)-dimethylmethane and bis(p-(acryloxyethoxy)-phenyl)dimethylmethane; such itaconates as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; such crotonates as ethylene glycol dicrotonate, tetramethylene glycol dicrotonate, pentaerythritol dicrotonate and sorbitol tetracrotonate; such isocrotonates as ethylene glycol diisocrotonate, pentaerythritol diisocrotonate and sorbitol tetraisocrotonate; such maleates as ethylene glycol dimaleate, triethylene glycol dimaleate, pentaerythritol dimaleate and sorbitol tetramaleate; and such other esters as ethylene glycol mono(meth)acrylate, propylene glycol mono(meth)acrylate, phenoxyethyl (meth)acrylate, ethylene glycol di(meth)acrylate, trimethylol ethane triacrylate, neopentyl glycol di(meth)acrylate, pentaerythritol tri(meth)acrylate, pentaerythritol tetra(meth)acrylate, dipentaerythritol hexa(meth)acrylate, hexanediol di(meth)acrylate, trimethylol propane tri(acryloyloxypropyl) ether, tri(acryloyloxyethyl) isocyanurate and mixtures thereof.

Examples of such an amide monomer of an aliphatic polyamine compound and an unsaturated carboxylic acid include methylenebis-acrylamide, methylenebismethacrylamide, 1,6-hexamethylenebis-acrylamide, 1,6-hexamethylenebis-methacrylamide, diethylene triamine trisacrylamide, xylylenebis-acrylamide and xylylenebismethacrylamide.

Examples of polymerizable compounds having at least one ethylenically unsaturated bond at the terminal include vinylurethane compounds having at least two polymerizable vinyl groups in the molecules obtained by adding a vinyl monomer having a hydroxyl group and represented by the following general formula (II) to a polyisocyanate compound having at least two isocyanate groups in the molecule, as those disclosed in Japanese Patent Publication for Opposition Purpose (hereinafter referred to as "J. P. KOKOKU") No. 48-41708:

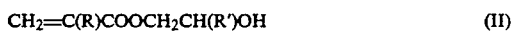

$$CH_2=C(R)COOCH_2CH(R')OH \quad (II)$$

wherein R and R' each represents hydrogen or methyl group.

In addition to the foregoing compounds, there may be mentioned such urethane acrylates as those disclosed in J. P. KOKOKU Nos. 48-41708 and 50-6034 and Japanese Patent Unexamined Published Application (hereinafter referred to as "J. P. KOKAI") No. 51-37193; such polyester acrylates as those disclosed in J. P. KOKAI No. 48-64183 and J. P. KOKOKU Nos. 49-43191 and 52-30490; and such polyfunctional acrylates and methacrylates as epoxy acrylates obtained by reacting an epoxy resin and a (meth)acrylic acid. Moreover, it is also possible to use compounds listed in Bulletin of Japan Adhesives Association (Nippon Setchaku Kyokai Shi), 1984, Vol 20, No. 7, pp 300–308, as photohardenable monomers and oligomers.

These polymerizable compounds having ethylenically unsaturated bonds can be used in an amount of 5 to 50% by weight (hereunder simply referred to as "%") of the total weight of the composition, and preferably 10 to 40%.

The photopolymerization initiators, the use of which is the important characteristic of the photopolymerizable composition according to the present invention will now explained in detail below.

In the photopolymerization initiators which are represented by the following general formula (I) and are employed in the photopolymerizable composition of the present invention:

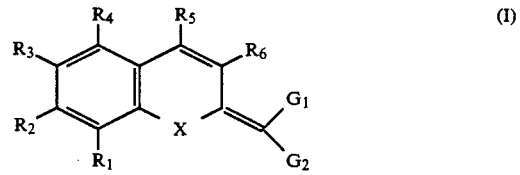

the alkyl groups included in the definition of $R_1$ to $R_6$ may be those having 1 to 20 carbon atoms such as methyl, ethyl and tert-butyl groups. The aryl group may be those having 6 to 10 carbon atoms such as phenyl group. The alkoxy groups included in the definition of $R_1$ to $R_4$ may be those having 1 to 6 carbon atoms such as methoxy, ethoxy and butoxy groups. The substituted amino groups in the definition of $R_1$ to $R_4$ may be alkylamino group, in which the alkyl moiety has 1 to 20 carbon atoms, such as methylamino, dimethylamino and diethylamino groups; and arylamino groups having 6 to 10 carbon atoms such as diphenylamino, piperidino and morpholino groups.

These alkyl, aryl, alkoxy, alkylamino and arylamino groups may have substituents. Examples of such substituents include halogen atoms such as fluorine, chlorine and bromine atoms; alkoxycarbonyl groups such as ethoxycarbonyl group; alkoxy groups such as methoxy and ethoxy groups; aryl groups such as phenyl group; and cyano group.

As already explained, $R_1$ to $R_4$ may form a ring comprised of non-metallic atoms together with the carbon atoms to which they are bonded. Examples of the compounds including such rings are those represented by the following general formulas (A) to (C):

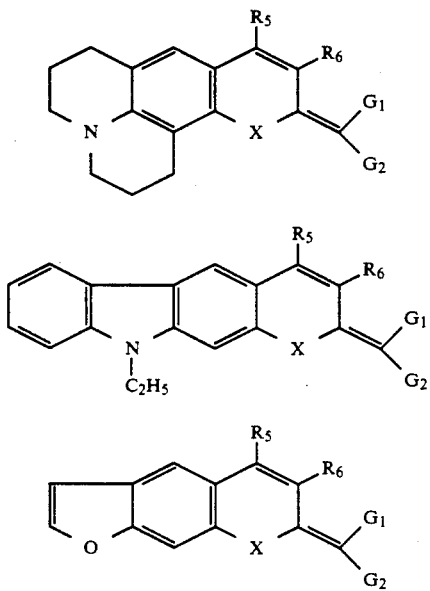

Moreover, when $R_5$ and $R_6$ represent acyl groups, the acyl group may be acetyl and those having an alkyl group having 1 to 10 carbon atoms and an aryl group; the alkoxycarbonyl groups in $R_5$ and $R_6$ may be those having an alkyl group having 1 to 6 carbon atoms such as ethoxycarbonyl group. The substituted alkenyl groups therein may be those having 2 to 10 carbon atoms such as styryl group and the heteroaromatic groups therein may be those represented by the following general formulas (D) to (F):

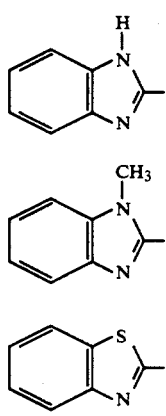

In addition, $R_5$ and $R_6$ may form a non-metallic ring together with the carbon atoms to which they are bonded as explained above. Examples of the compounds including such rings are those represented by the following genral formula (G):

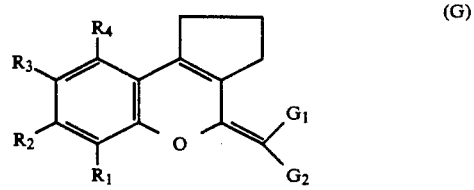

When X is a nitrogen atom having a substituent, examples of such substituents include the same alkyl groups and aryl groups as those listed above in connection with $R_1$ to $R_6$. $G_1$ and $G_2$ may be identical or different and each represents hydrogen atom, cyano group, an alkoxycarbonyl group having an alkyl group of 1 to 10 carbon atoms such as ethoxycarbonyl group, an aryloxycarbonyl group having an aryl group of 6 to 10 carbon atoms such as phenoxycarbonyl group, an acyl group having 1 to 6 carbon atoms such as acetyl or propionyl group, an arylcarbonyl group having 7 to 11 carbon atoms such as benzoyl group, an alkylthio group having 1 to 6 carbon atoms such as methylthio or ethylthio group, an arylthio group having 6 to 10 carbon atoms such as phenylthio group, an arylsulfonyl group having 6 to 10 carbon atoms such as phenylsulfonyl group, an alkylsulfonyl group having 1 to 6 carbon atoms such as methylsulfonyl or ethylsulfonyl group, or a fluorosulfonyl group.

These alkoxycarbonyl, aryloxycarbonyl, acyl, arylcarbonyl, alkylthio, arylthio, arylsulfonyl and alkysulfonyl groups may have substituents. Examples of such substituents include halogen atoms such as chlorine; alkoxycarbonyl groups having an alkyl group of 1 to 6 carbon atoms; carboxyl group; aryl groups having 6 to 10 carbon atoms; alkoxy groups having 1 to 6 carbon atoms; and cyano group. Moreover, aryloxycarbonyl, arylcarbonyl, arylthio and arylsulfonyl groups may further have an alkyl group having 1 to 6 carbon atoms such as methyl group as the substituent in addition to the foregoing groups.

As explained above, $G_1$ and $G_2$ may form a ring of nonmetallic atoms together with the carbon atoms to which they are bonded. Such a ring is usually used as an acidic nucleus of merocyanine dyes and examples thereof include as follows:

(a) 1,3-dicarbonyl nucleus, for instance, 1,3-indanedione, 1,3-cyclohexanedione, 5,5-dimethyl-1,3-cyclohexanedione and 1,3-dioxane-4,6-dione.

(b) pyrazolinone nucleus, for instance, 3-methyl-1-phenyl-2-pyrazolin-5-one, 1-phenyl-2-pyrazolin-5-one and 1-(2-benzothiazoyl)-3-methyl-2-pyrazolin-5-one.

(c) isoxazolinone nucleus, for instance, 3-phenyl-2-isoxazolin-5-one and 3-methyl-2-isoxazolin-5-one.

(d) oxyindole nucleus, for instance, 1-alkyl-2,3-dihydro-2-oxyindole.

(e) 2,4,6-triketohexahydropyrimidine nucleus, for instance, barbituric acid, 2-thiobarbituric acid and derivatives thereof. Examples of such derivatives include 1-alkyl derivatives such as 1-methyl and 1-ethyl derivatives; 1,3-dialkyl derivatives such as 1,3-diethyl and 1,3-dibutyl derivatives; 1,3-diaryl derivatives such as 1,3-diphenyl, 1,3-di(p-chlorophenl) and 1,3- di(p-ethoxycarbonylphenyl) derivatives; and 1-alkyl-3-aryl derivatives such as 1-ethyl-3-phenyl derivative.

(f) 2-thio-2,4-thiazolidinedion nucleus, for instance, rhodanine and derivatives thereof. Examples of such derivatives include 3-alkylrhodanine such as 3-ethylrhodanine and 3-allylrhodanine; and 3-arylrhodanine such as 3-phenylrhodanine.

(g) 2-thio-2,4-oxazolidinedion(2-thio-2,4-(3H,5H)-oxazoledion nucleus, for instance, 2-ethyl-2-thio-2,4-oxazolidinedion.

(h) thianaphthenone nucleus, for instance, 3-(2H)-thianaphthenone and 3-(2H)-thianaphthenon-1,1-dioxide.

(i) 2-thio-2,5-thiazolidinedion nucleus, for instance, 3-ethyl-2-thio-2,5-thiazolidinedione.

(j) 2,4-thiazolidinedione nucleus, for instance, 2,4-thiazolidinedione, 3-ethyl-2,4-thiazolidinedione and 3-phenyl-2,4-thiazolidinedione.

(k) thiazolidinone nucleus, for instance, 4-thiazolidinone and 3-ethyl-4-thiazolidinone.

(l) 4-thiazolinone nucleus, for instance, 2-ethylmercapto-5-thiazolin-4-one and 2-alkylphenylamino-5-thiazolin-4-one.

(m) 2-imino-2-oxozolin-4-one nucleus (sub-hydantoin nucleus).

(n) 2,4-imidazolidinedione (hydantoin) nucleus, for instance, 2,4-imidazolidinedione and 3-ethyl-2,4-imidazolidinedione.

(o) 2-thio-2,4-imidazolidinedione-(2-thiohydantoin) nucleus, for instance, 2-thio-2,4-imidazolidinedione and 3-ethyl-2-thio-2,4-imidazolidinedione.

(p) 2-imidazolin-5-one nucleus, for instance, 2-n-propylmercapto-2-imidazolin-5-one.

(q) furan-5-one nucleus.

The photopolymerization initiators represented by the general formula (I) which can be used in the composition of the present invention may be prepared from a compound represented by the general formula (II) or (III) and a compound represented by the general formula (IV).

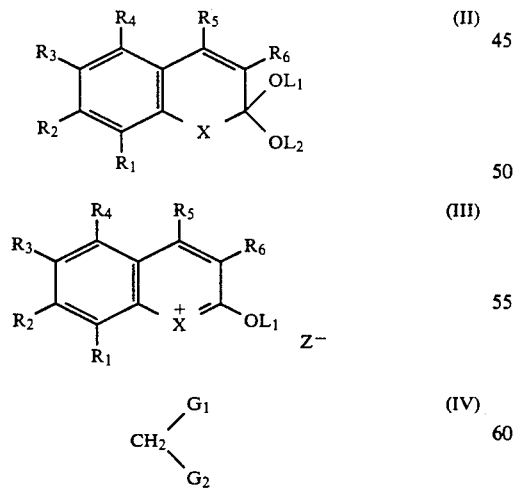

wherein $L_1$ and $L_2$ represent alkyl groups and $Z^-$ represents an anion.

Specific examples of the photopolymerization initiators represented by the general formula (I) are as follows:

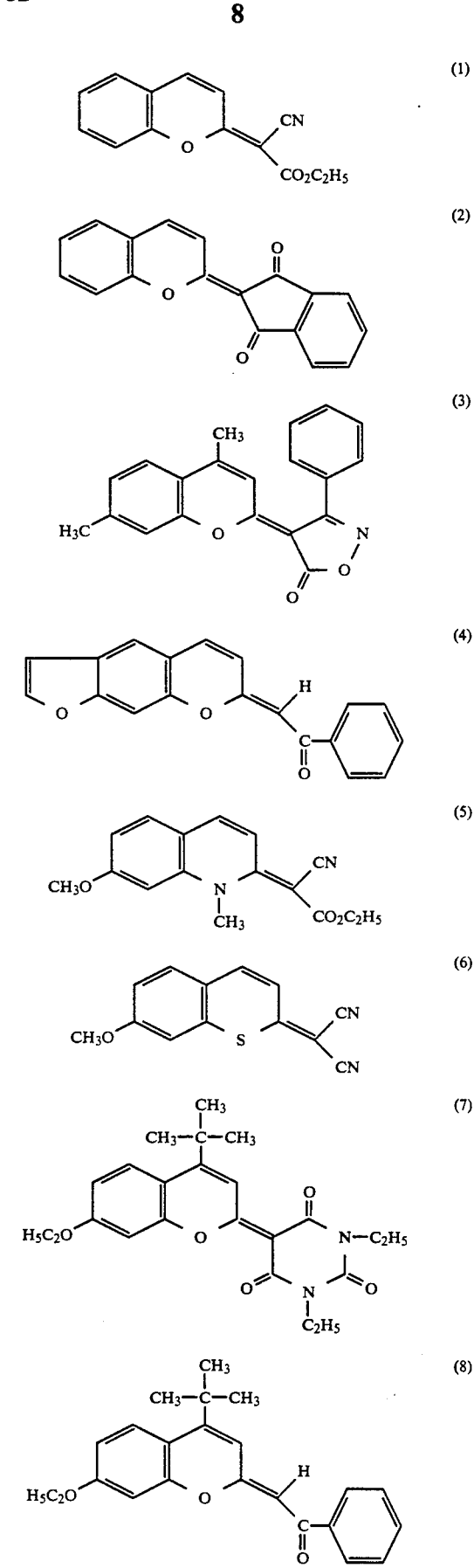

-continued
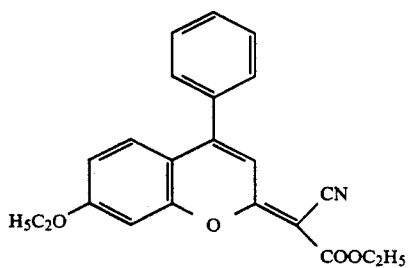 (9)
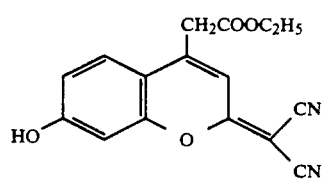 (10)
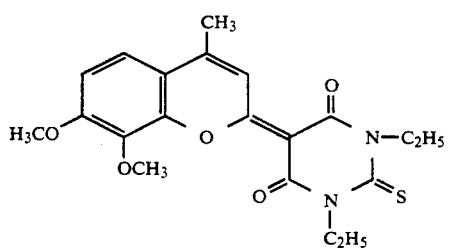 (11)
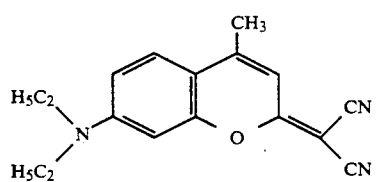 (12)
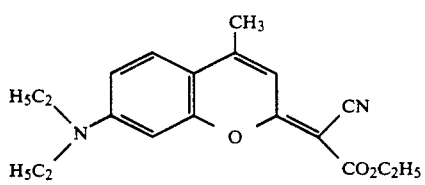 (13)
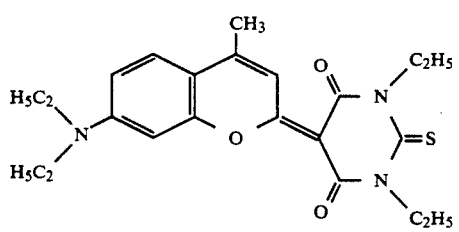 (14)
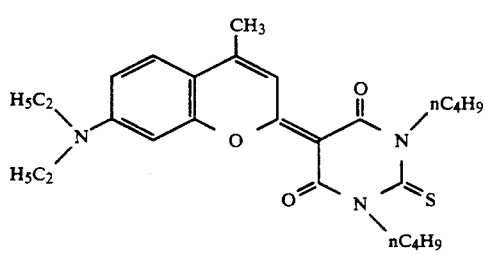 (15)
-continued
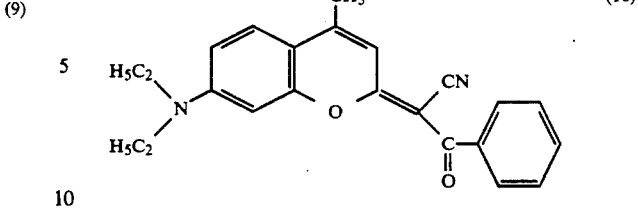 (16)
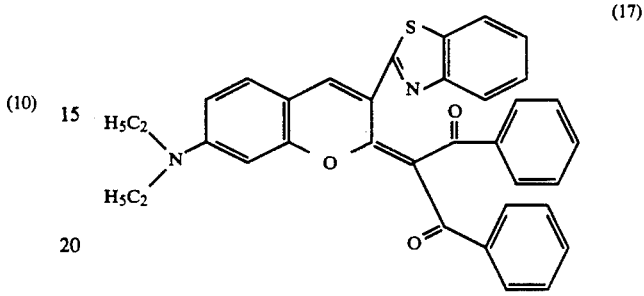 (17)
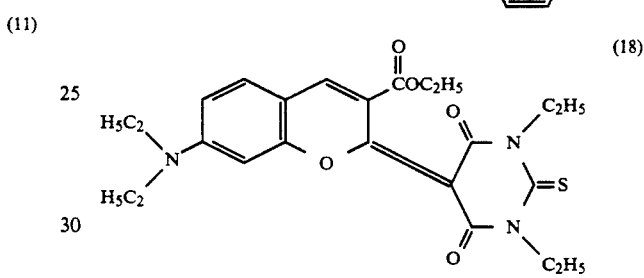 (18)
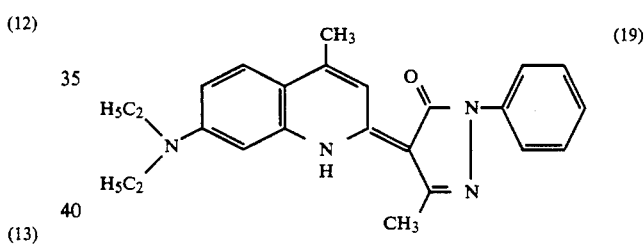 (19)
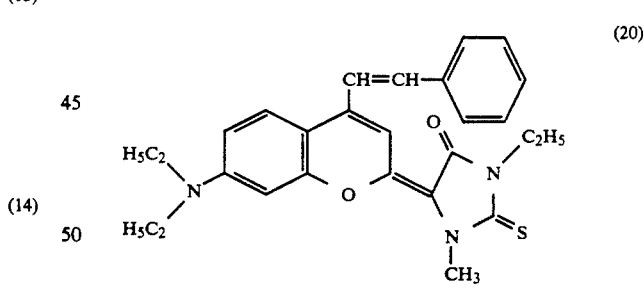 (20)
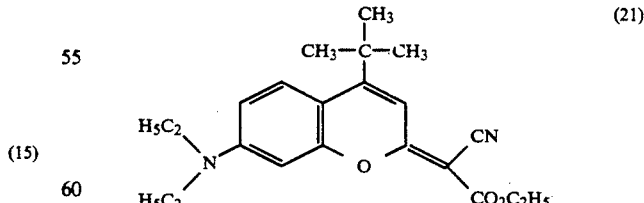 (21)
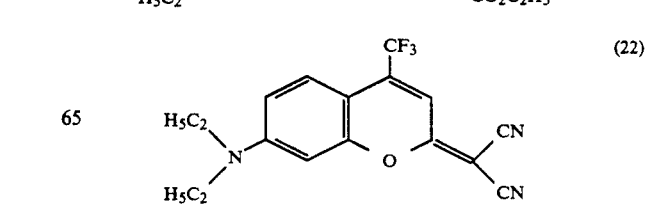 (22)

-continued
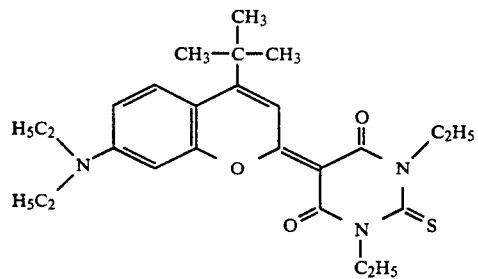
(23)
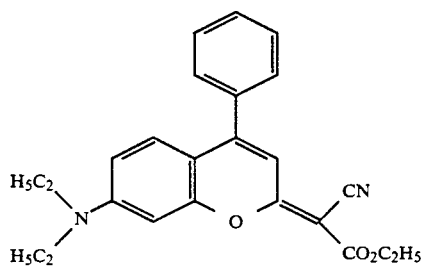
(24)
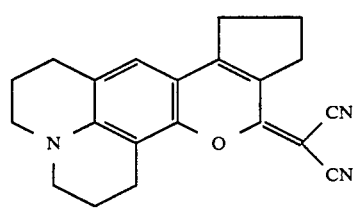
(25)
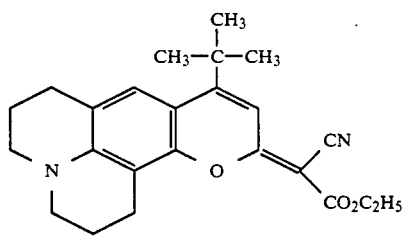
(26)
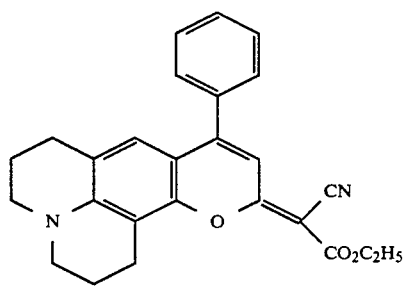
(27)
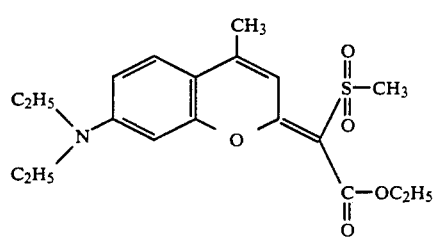
(28)
-continued
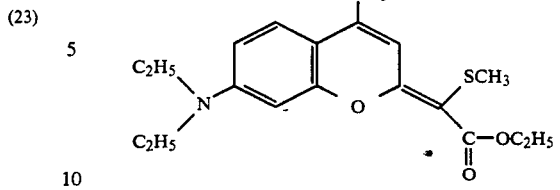
(29)
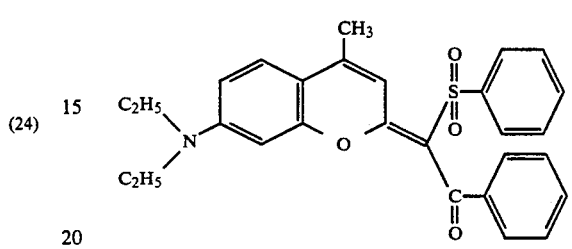
(30)
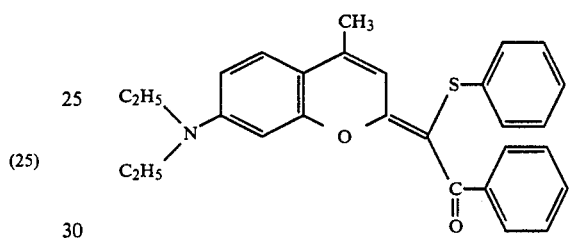
(31)
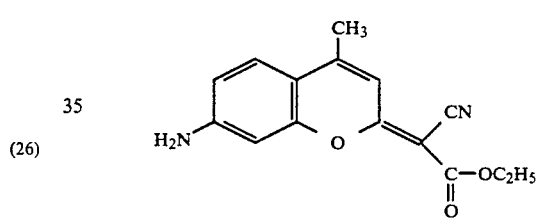
(32)
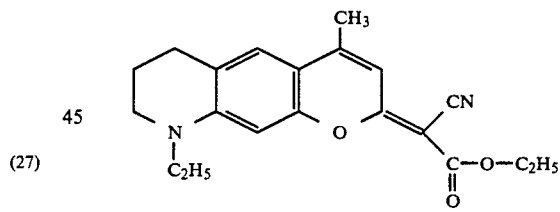
(33)
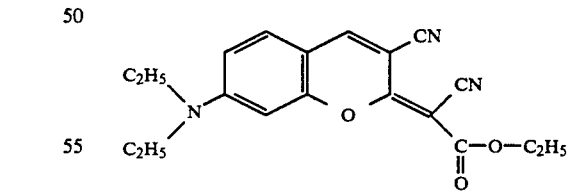
(34)
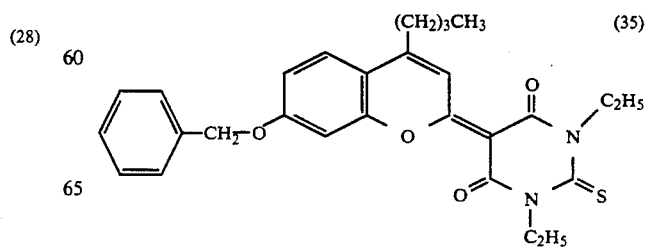
(35)

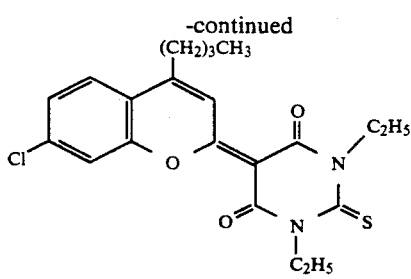
(36)

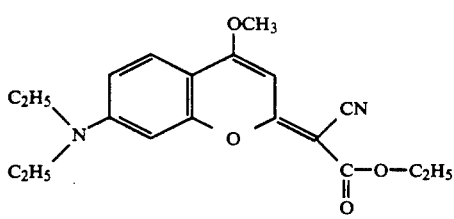
(37)

A binder may be incorporated into the photopolymerizable composition of the present invention according to need. With regard to such a binder, it should have a good compatibility with the polymerizable compound having ethylenically unsaturated bonds and the photopolymerization initiator so as not to cause separation during the whole manufacturing processes for the light-sensitive material, i.e., the preparation of the coating liquids, coating process and drying process, it should not exert adverse influence on the development, irrespective of it being dissolution development or swelling development, when the composition containing such a binder is formed into a light-sensitive layer or a photoresist layer and it should have properties required to form a tough film serving as a light-sensitive layer or a photoresist layer.

In general, the binder may properly be selected from linear organic polymers. Specific examples thereof include chlorinated polyethylene; chlorinated polypropylene; polyalkyl acrylates (examples of such alkyl groups include methyl, ethyl, n-propyl, iso-butyl, n-hexyl and 2-ethylhexyl); copolymers of an alkyl acrylate (examples of the alkyl groups are the same as those listed above) and at least one monomer, for instance, selected from the group consisting of acrylonitrile, vinyl chloride, vinylidene chloride, styrene and butadiene; polyvinyl chloride; copolymer of vinyl chloride and acrylonitrile; polyvinylidene chloride; copolymer of vinylidene chloride and acrylonitrile; polyvinyl acetate; polyvinyl alcohol; polyacrylonitrile; copolymer of acrylonitrile and styrene; copolymer of acrylonitrile, butadiene and styrene; polyalkyl methacrylates (examples of the alkyl groups include methyl, ethyl, n-propyl, n-butyl, iso-butyl, n-hexyl, cyclohexyl and 2-ethylhexyl); copolymers of an alkyl methacrylate and at least one monomer selected from the group consisting of, for instasnce, acrylonitrile, vinyl chloride, vinylidene chloride, styrene and butadiene; polystyrene; polyalphamethylstyrene; polyamides (6-nylon, 6,6-nylon and the like); methyl cellulose; ethyl cellulose; acetyl cellulose; polyvinyl formal and polyvinyl butyral.

In addition, if an organic polymer soluble in water or an alkaline aqueous solution is used, it becomes possible to develop the resultant composition with water or an alkaline aqueous solution. As such polymers, there may be mentioned such addition polymers having carboxyl groups at their side chains as methacrylic copolymers (e.g., copolymer of methyl methacrylate and methacrylic acid, copolymer of ethyl methacrylate and methacrylic acid, copolymer of butyl methacrylate and methacrylic acid, copolymer of benzyl methacrylate and methacrylic acid, copolymer of allyl methacrylate and methacrylic acid, copolymer of ethyl acrylate and methacrylic acid, and copolymer of methacrylic acid, styrene and ethyl methacrylate); acrylic copolymers (e.g., copolymer of ethyl acrylate and acrylic acid and copolymer of ethyl acrylate, styrene and acrylic acid); itaconic copolymers, crotonic copolymers and partially esterified maleic copolymers. In addition to these examples, other polymers such as acidic cellulose derivatives having carboxyl groups at their side chains may also be used in the invention.

These polymers may be used alone as the binder for the composition of the present invention. Moreover, these polymers may be used, as the binder, in combination in a proper ratio so far as each component of the mixture has a good compatibility with other components of the composition so as not to cause separation throughout the whole manufacturing processes, ie., from the preparation of coating liquid to the coating and drying processes.

The molecular weight of these polymers used as the binder may widely vary depending on the kind thereof. It is preferably in the range of from about 5,000 to about 2,000,000 and more preferably from 10,000 to 1,000,000.

It is desirable to add a heat polymerization inhibitor to the light-sensitive composition of the present invention for the purpose of preventing the polymerizable compound having ethylenically unsaturated bonds from causing undesirable heat polymerization during the preparation and the storage of the light-sensitive composition of the invention. Examples of suitable heat polymerization inhibitors include hydroquinone, p-methoxyphenol, di-tert-butyl-p-cresol, pyrogallol, tert-butylcatechol, benzoquinone, copper(I) chloride, phenothiazine, chloranil, naphthylamine, beta-naphthol, nitrobenzene and dinitrobenzene.

In addition, a dye or a pigment may optionally be incorporated into the composition of the invention for the purpose of coloration of the composition. Examples thereof include Methylene Blue, Crystal Violet, Rhodamine B, Fuchsine, Auramine, azo dyes, anthraquinone dyes, titanium oxide, carbon black, iron oxide, phthalocyanine pigments and azo pigments.

For the purpose of improving the adhesion of the composition to an aluminum substrate which is anodized (sulfuric acid or phosphoric acid) and then silicate treated, it is also possible to add a negative working diazo resin such as $PF_6$ salt of the condensate of p-diazodiphenylamine and formaldehyde.

The light-sensitive composition according to the present invention may further include a plasticizer according to need. Examples of such plasticizers include such phthalates as dimethyl phthalate, diethyl phthalate, dibutyl phthalate, dihexyl phthalate, dicyclohexyl phthalate and ditridecyl phthalate; such glycolates as dimethyl glycol phthalate, ethyl phthalylethyl glycolate and butyl phthalylbutyl glycolate; such phosphates as tricresyl phosphate and triphenyl phosphate; and such aliphatic dibasic acid esters as diisobutyl adipate, dioctyl adipate, dibutyl sebacate and dibutyl maleate.

The light-sensitive layer or the photoresist layer may be prepared by first dissolving the aforementioned various components of the light-sensitive composition of the present invention and then coating the resultant solution on a proper substrate according in a conventional manner. In this connection, the preferred ratio between the components of the composition is as follows the amount of each component being expressed as parts by weight on the basis of 100 parts by weight of the polymerizable compound having ethylenically unsaturated bonds:

| Component | Preferred Range | Particularly Preferred Range |
|---|---|---|
| Photopolymerization Initiator | 0.01 to 50 | 0.1 to 20 |
| Binder | 0 to 1,000 | 0 to 500 |
| Heat Polymerization Inhibitor | 0 to 10 | 0 to 5 |
| Dye or Pigment | 0 to 50 | 0 to 20 |
| Plasticizer | 0 to 200 | 0 to 50 |

Examples of solvents which may be used to dissolve the light-sensitive composition of the present invention and to apply the composition onto the surface of the proper substrate include ethylene dichloride, cyclohexanone, methyl ethyl ketone, methyl cellosolve, ethyl cellosolve, methyl acetate cellosolve, propylene glycol monomethyl ether, propylene glycol monomethyl ether acetate, monochlorobenzene, toluene, xylene, ethyl acetate and butyl acetate. These solvents may be used alone or in combination.

When a PS plate is prepared from the composition of the invention, the amount of the composition to be coated on the surface of the substrate preferably ranges from 0.1 to 10.0 g/m$^2$ generally expressed as solid content and particularly preferred amount thereof ranges from 0.5 to 5.0 g/m$^2$.

The light-sensitive composition according to the present invention is quite adapted for the preparation of the light-sensitive layers of PS plates. Examples of the substrates suitable for the preparation of PS plates include hydrophilized aluminum plates such as silicate treated aluminum plates, anodized aluminum plates and silicate-electrodeposited aluminum plates; zinc plates; stainless steel plates; chromate treated copper plates; and hydrophilized plastic films or paper.

As already mentioned above, the light-sensitive composition according to the present invention may also be used to form the light-sensitive layers of photoresists. In such case, there may be employed a variety of substrates such as copper plates or copper-plated plates, stainless steel plates and glass plates. Moreover, a protective layer may be formed on the light-sensitive layer coated on the substrate in order to eliminate the plymerization inhibitory effect of oxygen in air. Such protective layers may be obtained from a polymer excellent in oxygen shielding effect, such as polyvinyl alcohol and cellulose acetates. As to the method for applying such a protective layer, reference is made to, for instance, U.S. Pat. No. 3,458,311 and J. P. KOKOKU No. 55-49729.

In addition to the foregoing application, the photopolymerizable composition of the present invention may be used in various field and applications, for instance, in the conventional photopolymerization reactions and as a photoresist for use in making print circuit boards.

From the foregoing detailed descriptions, it is clear that the photopolymerizable composition of the invention has a high sensitivity to actinic light. Therefore, the composition of the invention may be highly sensitive to light from a variety of light sources such as superhigh pressure, high pressure, medium pressure or low pressure mercury lamps, chemical lamp, carbon arc lamp, xenon lamp and metal halide lamps.

The photopolymerizable composition of the present invention will hereunder be explained in more detail with reference to the following preparation examples and non-limitative working examples and the effects actually attained according to the composition of the invention will also be discussed in detail.

Preparation Example: Preparation of Compound (13)

There were mixed 6.5 g of 2-methoxy-2-ethoxy-4-methyl-7-diethylamino-2H-benzopyran and 4 g of ethyl cyanoacetate and the mixture was heated at 150° C. for 30 minutes. After allowing the reaction product to cool, it was passed through a column packed with silica gel utilizing 1:1 mixture (volume ratio) of hexane and ethyl acetate as the eluent to remove black colored impurities and then the product was recrystallized from 50 ml of ethanol. The crystals were filtered off and dried to recover 1.2 g of brown colored crystals having melting point of 146° to 148° C.

Electron Spectrum (in tetrahydrofuran): λmax=473 nm. $\epsilon = 3.25 \times 10^4$.

IR Spectrum (KBr disk) cm$^{-1}$: 2200, 1683, 1583, 1512, 1420, 1350, 1140.

EXAMPLES 1 TO 5

The surface of an aluminum plate of 0.03 mm thick was grained with a nylon brush and an aqueous solution of pumice stone having a particle size of 400 mesh and then washed with water sufficiently. The aluminum plate was further etched by immersing it into 10% aqueous solution of sodium hydroxide at 60° C. for 60 seconds, followed by water washing with running water, neutralizing and washing with 20% nitric acid and then washing with water. The aluminum plate was subjected to an electrolytic surface roughening treatment, in 1% aqueous solution of nitric acid, at the anode time electricity of 160 coulomb/dm$^2$ using an alternating waved current of sign wave under $V_A = 12.7$ V. The surface roughness thereof was determined to be 0.6 microns (expressed as Ra). Subsequently, the plate was desmutted by immersing it into 30% aqueous solution of sulfuric acid at 55° C. for 2 minutes and thereafter the aluminum plate was anodized in 20% aqueous solution of sulfuric acid at a current density of 2 A/dm$^2$ so as to reduce the thickness thereof to 2.7 g/m$^2$.

A light-sensitive layer was formed by applying, onto the aluminum plate thus treated, the light-sensitive liquid of the following composition so that the coated amount thereof was equal to 1.5 g/m$^2$ (dry weight) and drying.

| | |
|---|---|
| Allyl Methacrylate/Methacrylic Acid Copolymer (molar ratio = 80/20) | 3.2 g |
| Pentaerythritol Tetraacrylate | 1.7 g |
| Photopolymerization Initiator | 5 mole % with respect to the monomer |
| Methyl Ethyl Ketone | 20 g |
| Propylene Glycol Monomethyl-ether Acetate | 20 g |
| Fluorine Nonionic Surfactant (manufacured and sold by 3M Corporation under the trade name of FLUORAD FC-430) | 0.03 g |

On the light-sensitive layer, an aqueous solution of 3% by weight of polyvinyl alcohol (dgree of saponification=86.5 to 89 mole %; degree of polymerization=1,000) was applied so that the dry weight thereof was 2 g/m² and then was dried at 100° C. for 2 minutes.

Using a vacuum printing frame equipment, the light-sensitive layer was exposed to light from a light source of PS LIGHT S type manufactured and sold by Fuji Photo Film Co., Ltd. (metal halide lamp; 2 KW) from a distance of 1 m for 1 minute. The metal halide lamp has a bright line spectrum between 300 to 450 nm. The sensitivity was determined by using a continuous step wedges having an LTF density difference of 0.15. In addition, the development of the exposed light-sensitive layer was effected by immersing it into the following developer at 25° C. for 1 minute.

| | |
|---|---|
| Benzyl Alcohol | 10 g |
| Monoethanolamine | 1 g |
| Triethanolamine | 10 g |
| Sodium Isopropylnaphthalene Sulfonate | 2 g |
| Pure Water | 1000 ml |

The results of the sensitivity measurement observed on the photopolymerizable compositions, each of which contained a different photopolymerization initiator, are summarized in Table I below.

TABLE I

| Ex. No. | Photopolymerization | Number of clear steps of gray scale step wedge |
|---|---|---|
| 1 | Compound No. 12 | 5.0 |
| 2 | Compound No. 13 | 3.0 |
| 3 | Compound No. 14 | 2.5 |
| 4 | Compound No. 15 | 3.0 |
| 5 | Compound No. 16 | 5.0 |

What is claimed is:

1. A photopolymerizable composition comprising at least one addition polymerizable compound having at least one ethylenically unsaturated bond in an amount of from 5 to 50% by weight of the photopolymerizable composition and 0.01 to 50 parts by weight per 100 parts by weight of the addition polymerizable compound(s) having the ethylenically unsaturated bond(s) of at least one photopolymerization initiator, 0 to 1,000 parts by weight per 100 parts by weight of the addition polymerizable compound(s) having the ethylenically unsaturated bond(s) of a binder, 0 to 10 parts by weight per 100 parts by weight of the addition polymerizable compound(s) having the ethylenically unsaturated bond(s) of a heat polymerization inhibitor, 0 to 50 parts by weight per 100 parts by weight of the addition polymerizable compound(s) having the ethylenically unsaturated bond(s) of a dye or a pigment and 0 to 200 parts by weight of a plasticizer per 100 parts by weight of the addition polymerizable compound(s) having the ethylenically unsaturated bond(s), wherein the addition polymerizable compound(s) having the ethylenically unsaturated bond(s) is selected from the group of those having, in the chemical structure thereof, at least one ethylenically unsaturated bond at the terminal thereof, and wherein the photopolymerization initiator is at least one compound represented by the general formula:

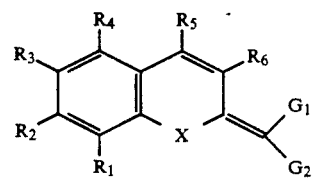

wherein $R_1$ to $R_4$ independently represent hydrogen atom, a halogen atom, an alkyl group, a substituted alkyl group, an aryl group, a substituted aryl group, hydroxyl group, an alkoxy group, a substituted alkoxy group, an amino group or a substituted amino group with the proviso that $R_1$ to $R_4$ may form a ring including non-metallic atoms together with the carbon atoms to which they are bonded; $R_5$ and $R_6$ may be identical or different and each represents hydrogen atom, an alkyl group, a substituted alkyl group, an aryl group, a substituted aryl group, a heteroaromatic group, an acyl group, cyano group, an alkoxycarbonyl group, carboxyl group or a substituted alkenyl group with the proviso that $R_5$ and $R_6$ may form a ring of non-metallic atoms together with the carbon atoms to which they are bonded; X represents O, S, NH or a nitrogen atom having a substituent; and $G_1$ and $G_2$ may be identical or different and each represents hydrogen atom, cyano group, an alkoxycarbonyl group, a substituted alkoxycarbonyl group, an aryloxycarbonyl group, a substituted aryloxycarbonyl group, an acyl group, a arylcarbonyl group, an alkylthio group, an arylthio group, an alkylsulfonyl group, an arylsulfonyl group or a fluorosulfonyl group with the proviso that $G_1$ and $G_2$ cannot simultaneously represent hydrogen atoms and that $G_1$ and $G_2$ may form a ring including non-metallic atoms together with the carbon atoms to which they are bonded, the ring formed from $G_1$ and $G_2$ being one suitable for use as an acidic nucleus of merocyanine dyes.

2. A photopolymerizable composition according to claim 1 wherein the compound represented by formula (I) is one containing the non-metallic ring formed from $R_1$ to $R_4$ together with the carbon atoms to which they are bonded being one member selected from the group consisting of those represented by the following general formulae:

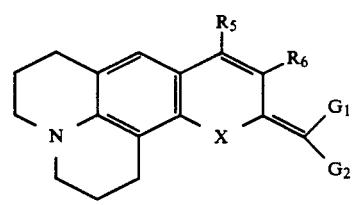

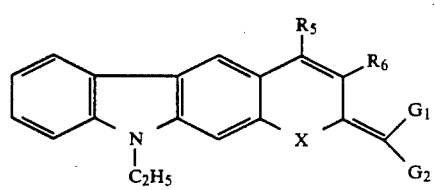

-continued

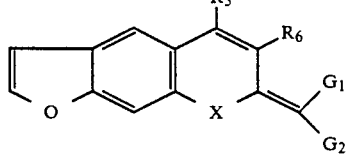

and compound (I) containing the non-metallic ring formed from $R_5$ and $R_6$ together with the carbon atoms to which they are bonded is one represented by the following general formula (G):

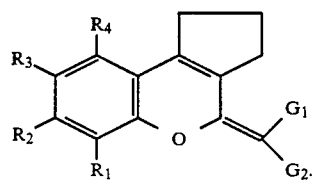

3. The photopolymerizable composition according to claim 1 wherein $R_2$ represents an alkyl group, an alkyl group, or a dialkylamino group; $R_1$ and $R_3$ each represents a hydrogen atom, with the proviso that $R_1$, and $R_3$, may form a julolidine skeleton together with $R_2$; $R_4$ represents a hydrogen atom, an alkyl group, or an alkoxy group; $R_5$ represents a hydrogen atom, an alkyl group, a substituted alkyl group, or an aryl group; $R_6$ represents a hydrogen atom, an alkyl group, a substituted alkyl group, and an alkoxycarbonyl group, a heteroaromatic group, a cyano group, or an acyl group; X represents O or NR where R is a hydrogen atom or an alkyl group; and $G_1$ and $G_2$, may be identical or different and each represents a hydrogen atom, a cyano group, an alkoxycarbonyl group, a benzoyl group or a substituted benzoyl group with the proviso that $G_1$ and $G_2$ may form a ring of 1,3-dicarbonyl nucleus; 2,4,6-triketohexahydropyrimidine nucleus; or 2-thio-2,4-thiazolidinedione nucleus.

4. A photopolymerizable composition according to claim 1 wherein in the general formula (I), the alkyl group included in the definition of $R_1$ to $R_6$ is one having 1 to 20 carbon atoms; the aryl group is one having 6 to 10 carbon atoms; the alkoxy group included in the definition of $R_1$ to $R_4$ is one having 1 to 6 carbon atoms; the substituted amino group in the definition of $R_1$ to $R_4$ is an alkylamino group, in which the alkyl moiety has 1 to 20 carbon atoms or an arylamino group having 6 to 10 carbon atoms; these alkyl, aryl, alkoxy, alkylamino and arylamino groups may have substituents selected from the group consisting of halogen atoms, alkoxycarbonyl groups, alkoxy groups, aryl groups and cyano group; compound (I) containing the non-metallic ring formed from $R_1$ to $R_4$ together with the carbon atoms to which they are bonded is one member selected from the group consisting of those represented by the following general formulas (A) to (C):

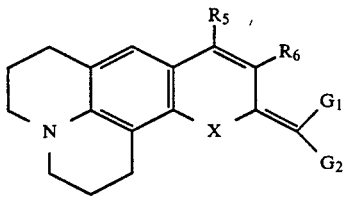

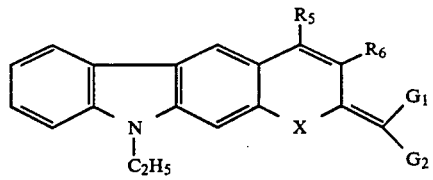

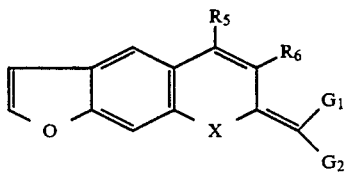

the acyl group in the definition of $R_5$ and $R_6$ is acetyl group or those having an alkyl group having 1 to 10 carbon atoms and an aryl group having 6 to 10 carbon atoms; the alkoxycarbonyl group in $R_5$ and $R_6$ is one having an alkyl group having 1 to 6 carbon atoms; the substituted alkenyl group therein is one having 2 to 10 carbon atoms; the heteroaromatic group therein is a member selected from the group consisting of those represented by the following general formulas (D) to (F):

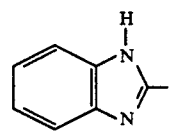

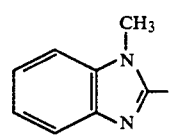

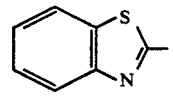

the compound (I) containing the non-metallic ring formed from $R_5$ and $R_6$ together with the carbon atoms to which they are bonded is one represented by the following general formula (G):

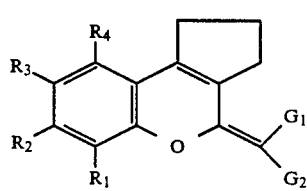

and in the nitrogen atom having a substituent included in the definition of X, the substituent is a member selected from the same alkyl groups and aryl groups as those listed above in connection with $R_1$ to $R_6$.

5. A photopolymerizable composition according to claim 1 wherein $G_1$ and $G_2$ may be identical or different and each represents hydrogen atom, cyano group, an alkoxycarbonyl group having an alkyl group of 1 to 10 carbon atoms, an aryloxycarbonyl group having an aryl group of 6 to 10 carbon atoms, an acyl group having 1 to 6 carbon atoms, an arylcarbonyl group having 7 to 11 carbon atoms, an alkylthio group having 1 to 6 carbon atoms, an arylthio group having 6 to 10 carbon atoms, an arylsulfonyl group having 6 to 10 carbon atoms, an alkylsulfonyl group having 1 to 6 carbon atoms, or a fluorosulfonyl group; these alkoxycarbonyl, aryloxycarbonyl, acyl, arylcarbonyl, alkylthio, arylthio, arylsulfonyl and alkylsulfonyl groups may have substituents selected from halogen atoms, alkoxycarbonyl groups having an alkyl group of 1 to 6 carbon atoms, carboxyl group, aryl groups having 6 to 10 carbon atoms, alkoxy groups having 1 to 6 carbon atoms and cyano group; the aryloxycarbonyl, arylcarbonyl, arylthio and arylsulfonyl groups may further have an alkyl group having 1 to 6 carbon atoms as the substituent in addition to the foregoing groups; and the ring formed from $G_1$ and $G_2$ together with the carbon atoms to which they are bonded is a ring usually used as an acidic nucleus of merocyanine dyes.

6. A photopolymerizable composition according to claim 1 wherein the amount of the addition polymerizable compound is in the range of from 10 to 40% by weight.

7. A photopolymerizable composition according to claim 1 wherein it further contains at least one binder.

8. A photopolymerizable composition according to claim 7 wherein the binder is a linear organic polymer and the molecular weight thereof is in the range of from about 5,000 to about 2,000,000.

9. A photopolymerizable composition according to claim 1 wherein it further comprises at least one heat polymerization inhibitor selected from the group consisting of hydroquinone, p-methoxyphenol, di-tert-butyl-p-cresol, pyrogallol, tert-butylcatechol, benzoquinone, copper(I) chloride, phenothiazine, chloranil, naphthylamine, betanaphthol, nitrobenzene and dinitrobenzene.

10. A photopolymerizable composition according to claim 1 wherein it further comprises a dye or a pigment.

11. A photopolymerizable composition according to claim 1 wherein it comprises a negative working diazo resin.

12. A photopolymerizable composition according to claim 1 wherein it comprises a plasticizer.

13. A photopolymerizable composition according to claim 1 wherein it comprises 0.1 to 20 parts by weight of the photopolymerization initiator, 0 to 500 parts by weight of the binder, 0 to 5 parts by weight of the heat polymerization inhibitor, 0 to 20 parts by weight of the dye or the pigment and 0 to 50 parts by weight of the plasticizer, per 100 parts by weight of the polymerizable compound having ethylenically unsaturated bonds.

14. A photopolymerizable composition according to claim 1 wherein it is used for manufacturing presensitized plates for use in making lithographic printing plates.

15. A photopolymerizable composition according to claim 1 wherein it is used for preparing a light-sensitive layer of photoresist.

* * * * *